United States Patent
Yamanaka et al.

(10) Patent No.: US 10,211,056 B2
(45) Date of Patent: Feb. 19, 2019

(54) SEMICONDUCTOR DEVICE MANUFACTURING METHOD

(71) Applicant: Mitsubishi Electric Corporation, Tokyo (JP)

(72) Inventors: Nobuaki Yamanaka, Tokyo (JP); Daisuke Chikamori, Tokyo (JP); Yoshio Muto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/116,617

(22) PCT Filed: Apr. 25, 2014

(86) PCT No.: PCT/JP2014/061749
§ 371 (c)(1),
(2) Date: Aug. 4, 2016

(87) PCT Pub. No.: WO2015/162786
PCT Pub. Date: Oct. 29, 2015

(65) Prior Publication Data
US 2016/0351396 A1   Dec. 1, 2016

(51) Int. Cl.
*H01L 21/04* (2006.01)
*H01L 21/027* (2006.01)
(Continued)

(52) U.S. Cl.
CPC ........ *H01L 21/0495* (2013.01); *H01L 21/027* (2013.01); *H01L 21/0274* (2013.01);
(Continued)

(58) Field of Classification Search
CPC .................................................. H01L 21/0495
See application file for complete search history.

(56) References Cited

U.S. PATENT DOCUMENTS 6,632,115 B1   10/2003   Tsujimura et al.
6,828,079 B2   12/2004   Suetsugu et al.
(Continued)

FOREIGN PATENT DOCUMENTS

CN   1828950 A    9/2006
CN   102509743 A   6/2012
(Continued)

OTHER PUBLICATIONS

Notification of Transmittal of Translation of the International Preliminary Report on Patentability and Translation of Written Opinion of the International Searching Authority; PCT/JP2014/061749 dated Nov. 3, 2016.
(Continued)

*Primary Examiner* — Alexander G Ghyka
(74) *Attorney, Agent, or Firm* — Studebaker & Brackett PC

(57) ABSTRACT

A resist layer is applied to a metal film disposed on a semiconductor substrate, using a positive photoresist having photosensitivity to at least one wavelength. The resist layer is exposed to light including a region of the one wavelength. The exposed resist layer is developed. After the step of developing the resist layer, the metal film is subjected to wet etching with the resist layer used as a mask, in an etching apparatus. The etching apparatus is placed in an environment irradiated with a lighting apparatus that emits light with a wavelength equal to or shorter than the one wavelength cut off.

4 Claims, 8 Drawing Sheets

(51) Int. Cl.

| | |
|---|---|
| *H01L 21/3213* | (2006.01) |
| *H01L 21/67* | (2006.01) |
| *H01L 29/40* | (2006.01) |
| *H01L 29/66* | (2006.01) |
| *H01L 29/872* | (2006.01) |
| *H01L 29/06* | (2006.01) |
| *H01L 29/16* | (2006.01) |
| H01L 29/78 | (2006.01) |
| H01L 29/739 | (2006.01) |

(52) U.S. Cl.
CPC .. *H01L 21/32134* (2013.01); *H01L 21/32139* (2013.01); *H01L 21/67086* (2013.01); *H01L 21/67115* (2013.01); *H01L 29/0615* (2013.01); *H01L 29/0619* (2013.01); *H01L 29/1608* (2013.01); *H01L 29/401* (2013.01); *H01L 29/6606* (2013.01); *H01L 29/872* (2013.01); H01L 29/66712 (2013.01); H01L 29/7393 (2013.01); H01L 29/7811 (2013.01)

(56) References Cited

U.S. PATENT DOCUMENTS

| | | | |
|---|---|---|---|
| 8,440,524 | B2 | 5/2013 | Fujiwara et al. |
| 8,486,838 | B2 | 7/2013 | Lee et al. |
| 9,209,108 | B2 | 12/2015 | Lee et al. |
| 2001/0038972 | A1 | 11/2001 | Lyons et al. |
| 2005/0112504 | A1 | 5/2005 | Terasawa et al. |
| 2010/0041237 | A1* | 2/2010 | Lee .................. H01L 21/31111 438/704 |
| 2010/0190347 | A1 | 7/2010 | RamachandraRao et al. |
| 2010/0213620 | A1 | 8/2010 | Hamada et al. |
| 2011/0207321 | A1 | 8/2011 | Fujiwara et al. |

FOREIGN PATENT DOCUMENTS

| | | |
|---|---|---|
| CN | 101859701 B | 11/2012 |
| JP | 05-323589 A | 12/1993 |
| JP | 08-203809 A | 8/1996 |
| JP | 2003-156849 A | 5/2003 |
| JP | 2004-083932 A | 3/2004 |
| JP | 2007-142092 A | 6/2007 |
| JP | 2010-506385 A | 2/2010 |
| JP | 2011-171551 A | 9/2011 |
| KR | 20030013361 A | 2/2003 |
| WO | 2000/034961 A1 | 6/2000 |
| WO | 2008/038947 A1 | 4/2008 |

OTHER PUBLICATIONS

International Search Report, PCT/JP2014/061749 dated Jul. 15, 2014.
An Office Action; "Notification of Reason(s) for Refusal", issued by the Japanese Patent Office dated Oct. 4, 2016, which corresponds to Japanese Patent Application No. 2016-514668 and is related to U.S. Appl. No. 15/116,617; with English language translation.
An Office Action issued by the German Patent Office dated Feb. 28, 2018, which corresponds to German Patent Application 11 2014 006 620.6 and is related to U.S. Appl. No. 15/116,617; with English translation.
An Office Action mailed by the Korean Intellectual Property Office dated May 17, 2018, which corresponds to Korean Patent Application No. 10-2016-7029545 and is related to U.S. Appl. No. 15/116,617.
An Office Action mailed by the State Intellectual Property Office of the People's Republic of China dated Aug. 20, 2018, which corresponds to Chinese Patent Application No. 201480078393.6 and is related to U.S. Appl. No. 15/116,617.
An Office Action issued by the Korean Patent Office (KIPO) dated Nov. 27, 2018, which corresponds to Korean Patent Application No. 10-2016-7029545 and is related to U.S. Appl. No. 15/116,617; with English language translation.

* cited by examiner

F I G. 3
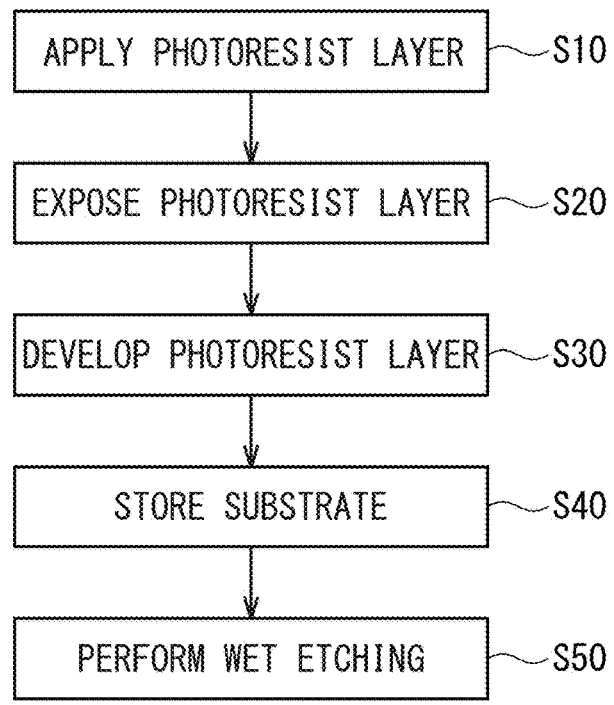
F I G. 4
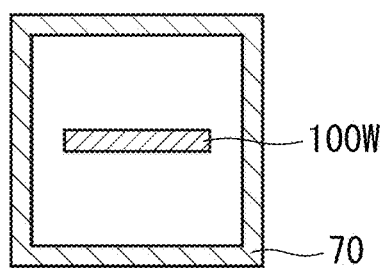

SEMICONDUCTOR DEVICE MANUFACTURING METHOD

TECHNICAL FIELD

The present invention relates to a semiconductor device manufacturing method, and more particularly to a semiconductor device manufacturing method including a wet etching process using a positive photoresist.

BACKGROUND ART

In manufacturing a semiconductor device, a metal film disposed on a semiconductor substrate is often patterned. As a typical patterning method, wet etching is performed with a resist layer used as a mask. The resist layer is generally formed by applying, exposing, and developing a photoresist.

In storing the photoresist before use and the resist layer before exposure, particular care has been taken conventionally. For example, according to Japanese Patent Application Laid-Open No. 5-323589, a photosensitive resin composition which is excellent in preservation stability is proposed. According to this document, it is suggested that when the photosensitive resin composition is formed into a dry film and stored in an unexposed state, the dry film can be prevented from being exposed to light for a long period of time.

PRIOR ART DOCUMENT

Patent Document

Patent Document 1: Japanese Patent Application Laid-Open No. 5-323589

SUMMARY OF INVENTION

Problems to be Solved by the Invention

As described above, care is generally taken to the dry film (resist layer) before exposure so that the dry film is not exposed to light. Meanwhile, after the exposure and subsequent development, it has been thought that there is no need to give special consideration for avoiding the exposure to light. However, the inventors of the present invention have newly found that in a case where a positive resist is used, if the consideration is not given to the resist layer after the development against the exposure to light, precision in patterning by wet etching is likely to be decreased.

The present invention was made to solve the above problems, and an object thereof is to provide a semiconductor device manufacturing method capable of enhancing precision in patterning by wet etching.

Means for Solving the Problems

The semiconductor device manufacturing method of the present invention has the following steps. A resist layer is applied to a metal film disposed on a semiconductor substrate, using a positive photoresist having photosensitivity to at least one wavelength. The resist layer is exposed to light including a region of the one wavelength. The exposed resist layer is developed. After the step of developing the resist layer, the metal film is subjected to wet etching with the resist layer used as a mask, in an etching apparatus. The etching apparatus is placed in an environment irradiated with a lighting apparatus that emits light with a wavelength equal to or shorter than the one wavelength cut off.

Effects of the Invention

According to the present invention, the etching apparatus is placed in the environment irradiated with the lighting apparatus that emits the light with the wavelength equal to or shorter than the one wavelength cut off. Thus, the metal film is prevented from being corroded at an interface between the resist layer and the metal film, at an end of the resist layer formed of a positive photoresist. As a result, the precision in patterning by wet etching can be enhanced.

BRIEF DESCRIPTION OF DRAWINGS

FIG. 3 is a flowchart schematically showing a configuration of the method for manufacturing the semiconductor device in FIG. 1.

FIG. 4 is a partial cross-sectional view schematically showing a second step of the method for manufacturing the semiconductor device in FIG. 1.

DESCRIPTION OF EMBODIMENT

Hereinafter, an embodiment of the present invention will be described with reference to the drawings. The same or corresponding part in the following drawings is marked with the same reference signs and its description is not repeated.

(Configuration of Semiconductor Device)

Figure 1:
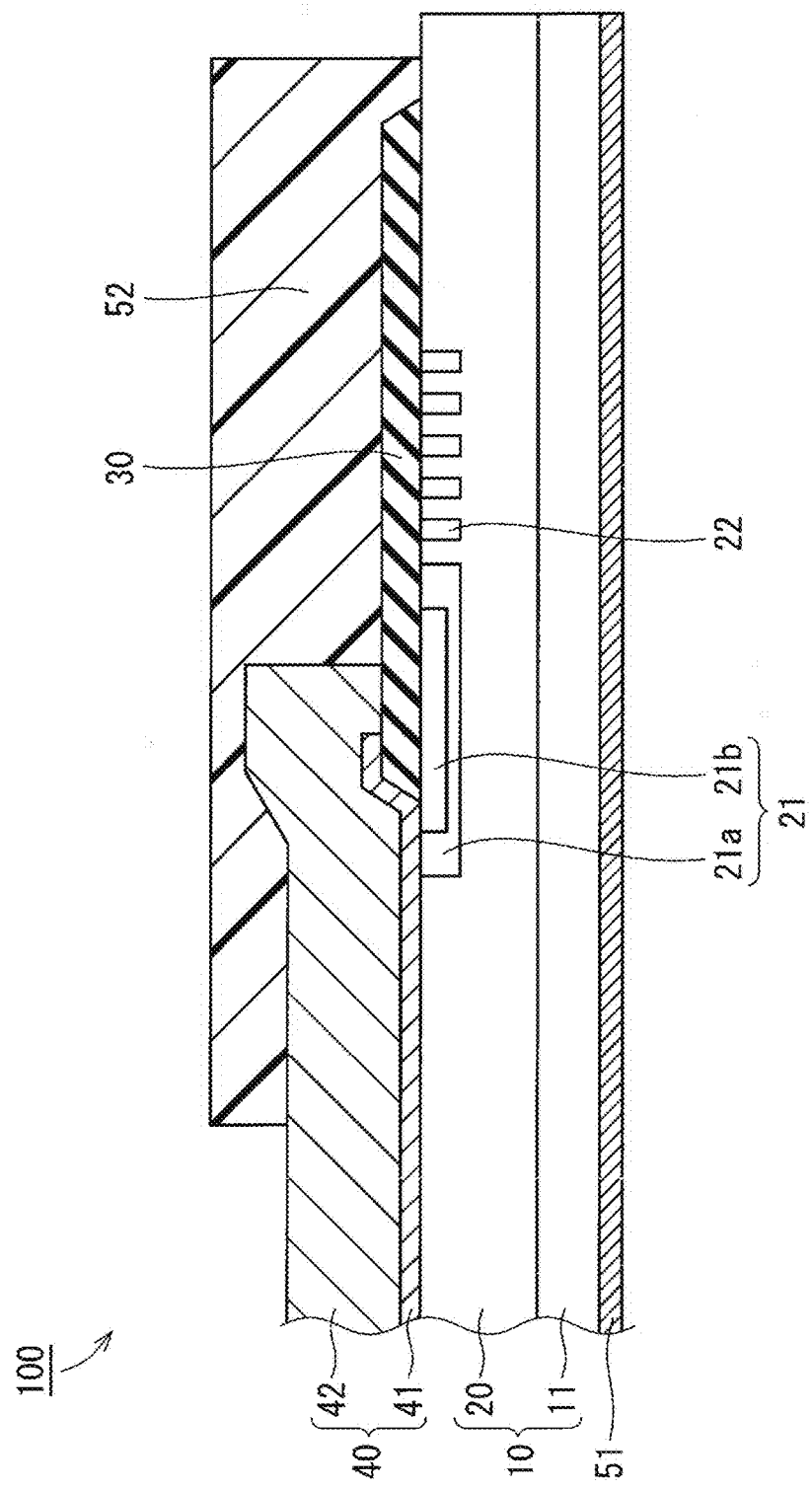
FIG. 1 is a partial cross-sectional view schematically showing a configuration of a semiconductor device in one embodiment of the present invention.

FIG. 1 schematically shows a configuration of a part (right end part in the drawing) of a power device 100 (semiconductor device) in this embodiment. The power device 100 is a schottky barrier diode and has a silicon carbide substrate 10 (semiconductor substrate), an interlayer insulating film 30, an anode electrode 40, a cathode electrode 51, and a protective film 52.

The silicon carbide substrate 10 is a so-called epitaxial substrate and includes a single-crystal substrate 11 and an epitaxial layer 20. The single-crystal substrate has an n type (first conductivity type). The epitaxial layer 20 has an n type and has an impurity concentration lower than an impurity concentration of the single-crystal substrate 11. Guard rings 21 and 22 each having a p type (second conductivity type) are provided in a surface of the epitaxial layer 20 as a termination structure. The guard ring disposed in an innermost side, that is, the guard ring 21 includes a low-concentration region 21a having a relatively low impurity concentration and a high-concentration region 21b having a relatively high impurity concentration. The high-concentration region 21b is separated from an n-type part of the epitaxial layer 20, that is, a drift layer, by the low-concentration region 21a.

The interlayer insulating film 30 is made from silicon dioxide and in this embodiment, it is a tetraethyl orthosilicate (TEOS) film, that is, a film made from TEOS. The interlayer insulating film 30 is provided along an outer periphery of a surface of the silicon carbide substrate 10. In other words, the interlayer insulating film 30 has an opening in its center.

The anode electrode has a Ti film 41 (metal film) serving as a schottky electrode, and a pad electrode 42 provided on the Ti film 41. The thickness of the Ti film is typically 150 nm or more and 250 nm or less. The Ti film 41 is in contact with the epitaxial layer 20 in the opening of the interlayer insulating film 30. The Ti film 41 forms a schottky junction with the part of the n-type drift layer of the epitaxial layer 20. Furthermore, the Ti film 41 is in contact with the high-concentration region 21b of the guard ring 21. Each edge of the Ti film 41 and the pad electrode 42 is disposed on the interlayer insulating film 30. The pad electrode 42 is an Al layer, for example.

The cathode electrode 51 and the anode electrode 40 sandwich the silicon carbide substrate 10. That is, the cathode electrode 51 is disposed on a surface of the single-crystal substrate 11 opposite to a surface on which the anode electrode 40 is provided.

The protective film 52 covers an end of the anode electrode 40 above the silicon carbide substrate 10. The protective film 52 has an opening to expose the pad electrode 42. The protective film 52 is made from an insulator, for example, a polyimide.

(Manufacturing Method)

Figure 2:
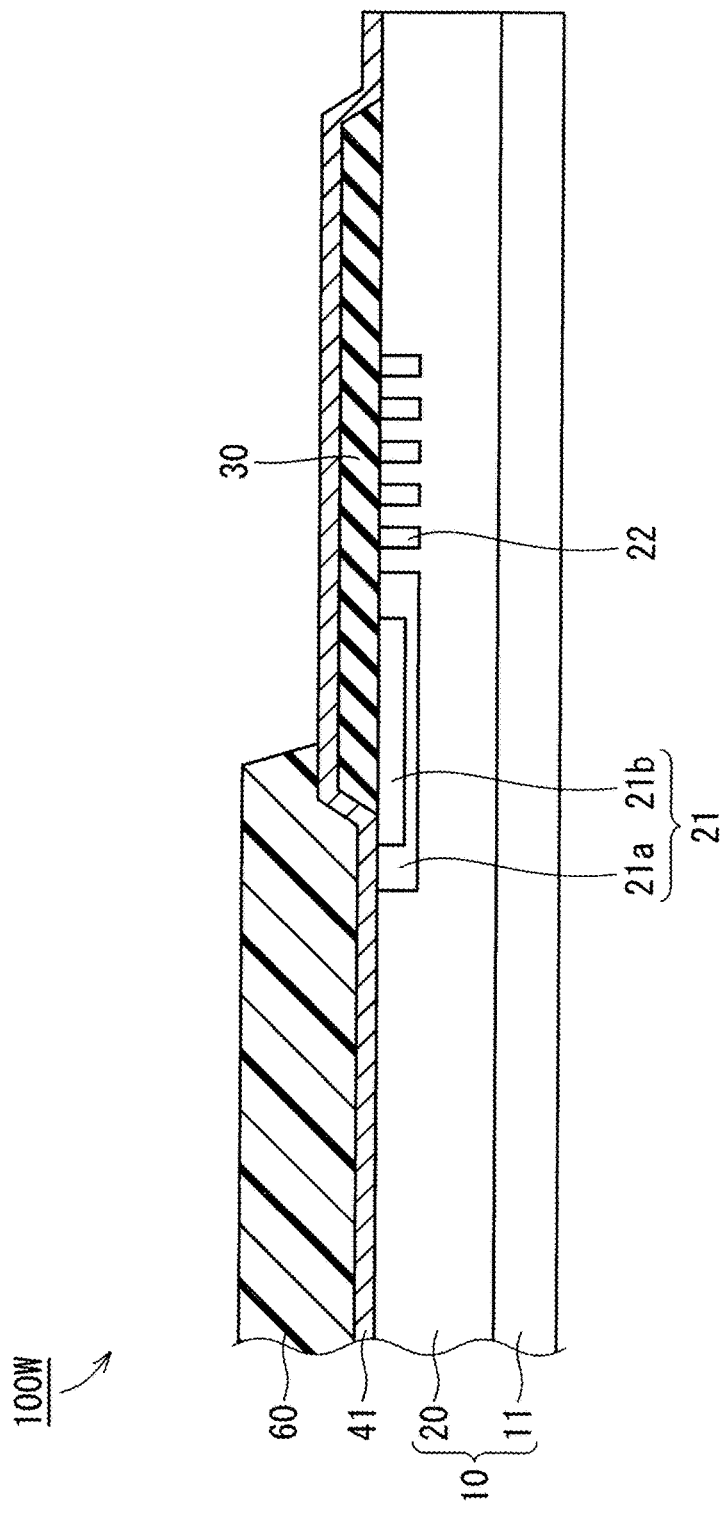
FIG. 2 is a partial cross-sectional view schematically showing a first step of a method for manufacturing the semiconductor device in FIG. 1.

Referring to FIG. 2, the guard rings 21 and 22 are formed in the epitaxial layer 20 of the silicon carbide substrate 10. Subsequently, the interlayer insulating film 30 is formed on the epitaxial layer 20. That is, the TEOS film is deposited and patterned. Subsequently, the Ti film 41 is deposited on the epitaxial layer 20 on which the interlayer insulating film 30 is provided.

Subsequently, a photolithography process is performed for patterning the Ti film 41. More specifically, a resist layer 60 is applied to the Ti film 41 provided on the silicon carbide substrate 10 using a positive photoresist having photosensitivity to a wavelength (one wavelength) of a g-line (spectral line of 436 nm) (FIG. 3: step S10). The positive photoresist preferably contains a novolac-type material.

Subsequently, the resist layer 60 is exposed to light including the g-line (a region of the one wavelength) using a photomask (FIG. 3: step S20). As a light source, a high-pressure mercury lamp is used, for example.

Subsequently, the exposed resist layer 60 is developed (FIG. 3: step S30). In this way, a pattern of the photomask is transferred to the resist layer 60. That is, a process substrate 100W is provided as shown in FIG. 2.

In the case where the positive photoresist has the photosensitivity to the g-line wavelength, the above photolithography process is performed in an environment irradiated with a yellow lamp, such as so-called yellow room. The yellow lamp cuts off light having a wavelength equal to or shorter than the g-line wavelength in order to prevent undesired exposure, and the lamp preferably cuts off light having a wavelength of about 500 nm or shorter in order to surely prevent exposure to light.

Referring to FIG. 4, the process substrate 100W provided after the resist layer 60 is developed may be stored in a light-shielding dark box 70 (container) before wet etching which will be described below (FIG. 3: step S40). This step S40 can be omitted.

Figure 5:
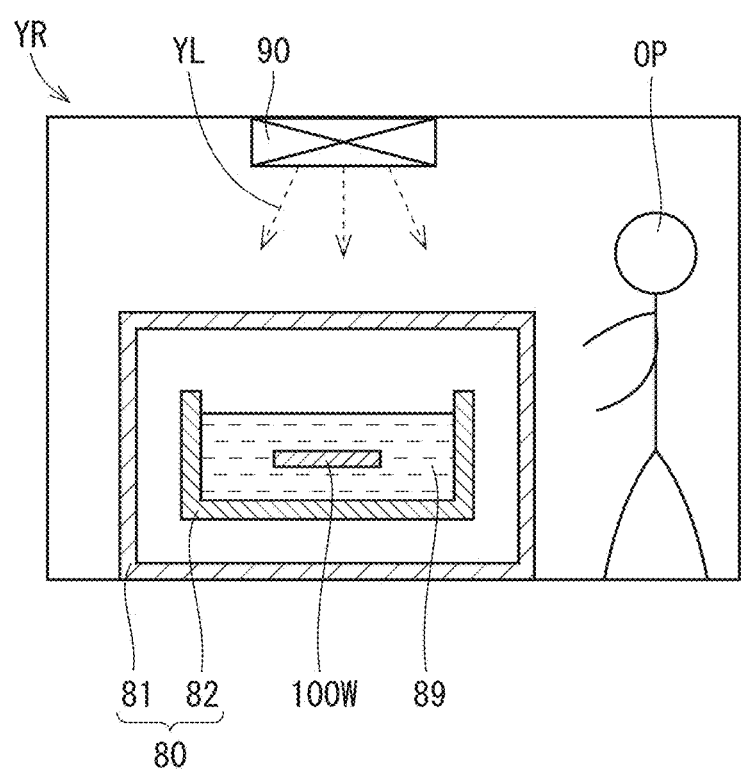
FIG. 5 is a partial cross-sectional view schematically showing a third step of the method for manufacturing the semiconductor device in FIG. 1.

Furthermore, referring to FIG. 5, the process substrate 100W (FIG. 2) is etched in an etching apparatus 80. More specifically, the Ti film 41 is subjected to wet etching with the resist layer 60 used as a mask (FIG. 3: step S50).

The etching apparatus 80 is placed in an environment of a yellow room YR, that is, in an environment irradiated with a yellow lamp 90 (lighting apparatus) that emits light YL with a wavelength equal to or shorter than the g-line wavelength cut off. This lamp is usually provided to ensure a view of an operator OP.

The etching apparatus 80 has a case 81 and a bath 82. An etchant 89 to be used for the wet etching is stored in the bath 82. The etchant 89 is an aqueous solution containing hydrogen peroxide. In order to raise an etching rate, the aqueous solution preferably contains ammonia in addition to hydrogen peroxide.

After the wet etching, the resist layer 60 is removed. Next, referring to FIG. 1 again, the cathode electrode 51, the pad electrode 42, and the protective film 52 are formed. Thus, the power device 100 is obtained.

Figure 6:
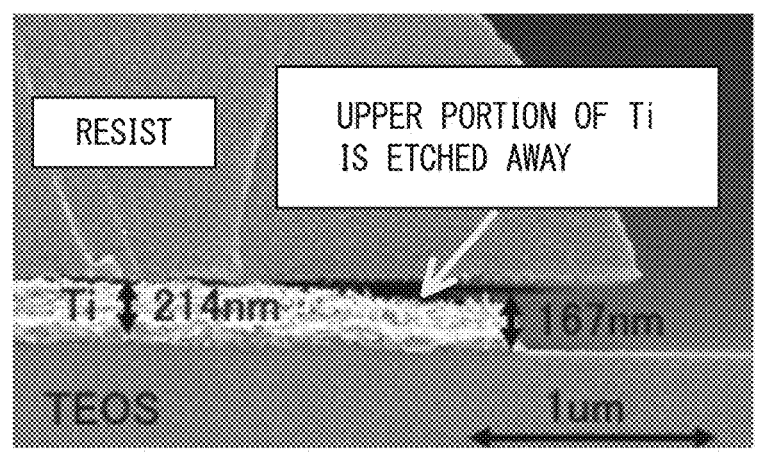
FIG. 6 is a partial cross-sectional photograph taken by a scanning electron microscope, and showing a state after a wet etching process in a semiconductor device manufacturing method in a comparative example.
Figure 7:
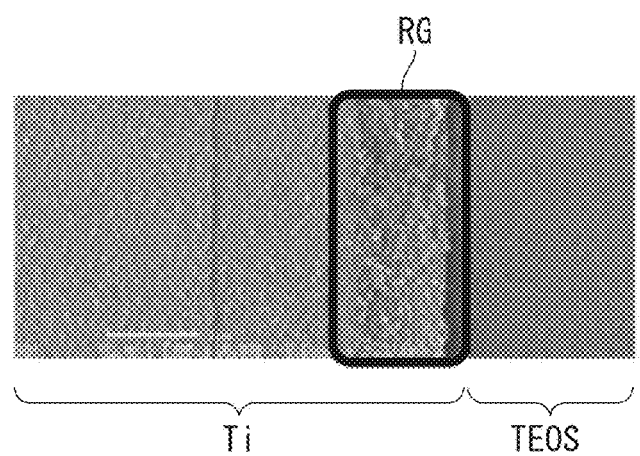
FIG. 7 is a partial planar photograph taken by a scanning electron microscope, and showing a state after resist layer is removed in the semiconductor device manufacturing method in the comparative example.
Figure 8:
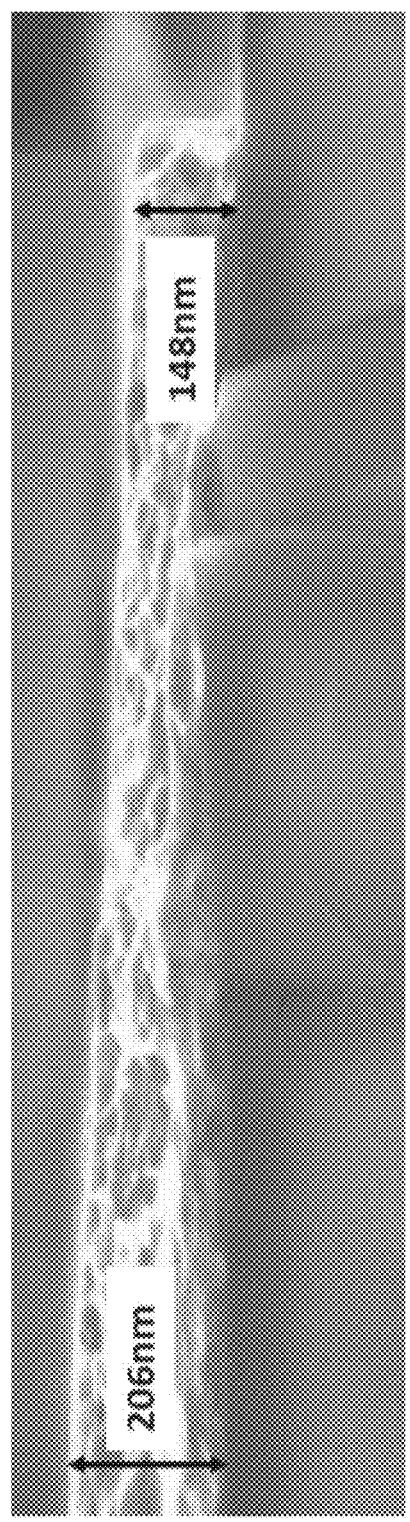
FIG. 8 is a partial cross-sectional photograph taken by a scanning electron microscope, and showing a state after the resist layer is removed in the semiconductor device manufacturing method in the comparative example.

Hereinafter, a comparative example will be described. In this comparative example, a common white fluorescent lamp was used instead of the yellow lamp 90 (FIG. 5). As a result, at an end of the resist layer, the Ti film was corroded at an interface between the resist layer and the Ti film, and the Ti film was reduced in thickness (see FIG. 6). Furthermore, the surface of the Ti film had a roughened portion in a region corresponding to the end of the resist layer (in a region RG in FIG. 7). As shown in FIG. 8, the roughened portion was reduced in thickness by about 25% (about 50 nm). Reasons for those phenomena inferred by the inventors of the present invention will be described below.

Figure 9A:
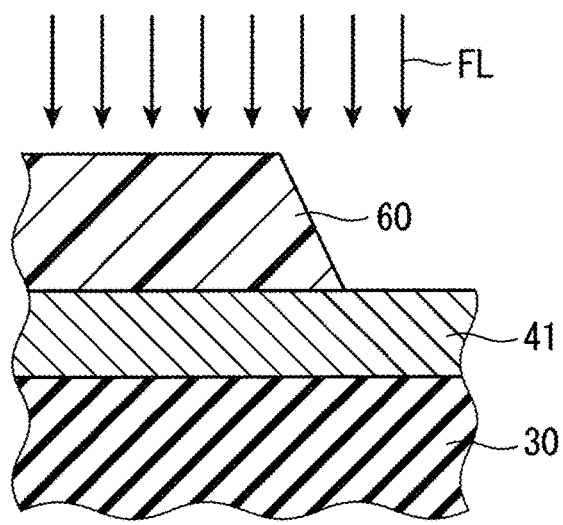
FIG. 9A is a partial cross-sectional view showing a state where light is incident on the resist layer after a development process, in the semiconductor device manufacturing method in the comparative example.
Figure 9B:
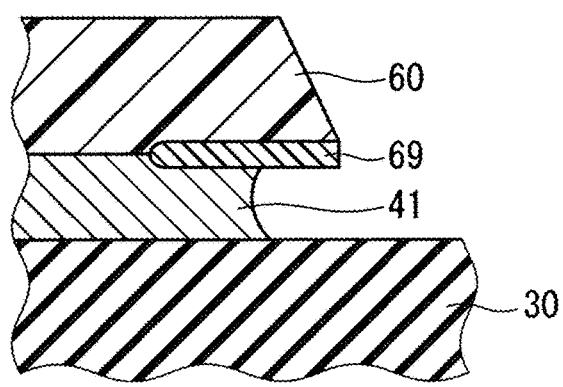
FIG. 9B is a partial cross-sectional view showing a course of the wet etching process in the semiconductor device manufacturing method in the comparative example.

In the comparative example, the resist layer 60 after the development process receives light FL (FIG. 9A) from the common white fluorescent lamp. Although the resist layer 60 has already been subjected to the development process, the interface between the resist layer 60 and the Ti film 41 is slightly exposed to the light FL, at the end of the resist layer 60. As a result, carboxylic acid is generated from the resist layer 60. This carboxylic acid reacts with the hydrogen peroxide in the etchant to produce percarboxylic acid 69 (FIG. 9B). Since percarboxylic acid has high oxidation power, the Ti film 41 is corroded at the portion where percarboxylic acid has been produced. That is, the Ti film 41 is corroded at the interface between the resist layer 60 and the Ti film 41, at the end of the resist layer 60. As a result, the surface of the Ti film 41 becomes rough and the thickness of the Ti film 41 is reduced, that is, precision in patterning by the wet etching is decreased.

Figure 10A:
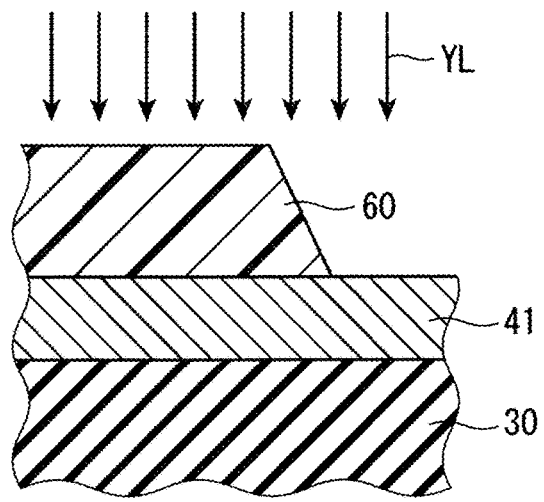
FIG. 10A is a partial cross-sectional view showing a state where light is incident on a resist layer after a development process, in a semiconductor device manufacturing method in one embodiment of the present invention.
Figure 10B:
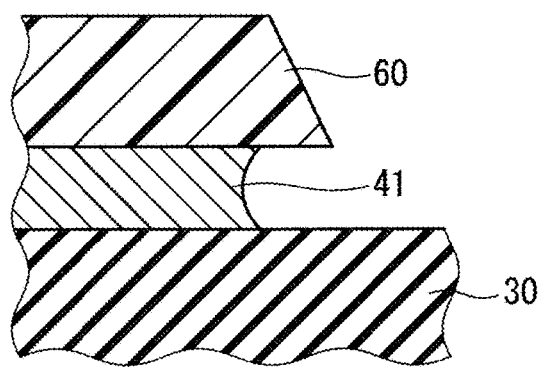
FIG. 10B is a partial cross-sectional view showing a course of a wet etching process in the semiconductor device manufacturing method in the one embodiment of the present invention.

Meanwhile, according to this embodiment, the etching apparatus 80 (FIG. 5) is placed in the environment of yellow room YR. Thus, the process substrate 100W receives the light YL (FIG. 10A) with the wavelength equal to or shorter than the g-line wavelength cut off when the operator OP puts the process substrate 100W into the etching apparatus 80 and takes it out of the etching apparatus 80. In addition, the process substrate 100W also receives light from a working environment during the wet etching unless the case 81 has a perfect light-shielding property, but this light is also the light YL with the wavelength equal to or shorter than the g-line wavelength cut off. Thus, unlike the comparative example, there is no unintentional generation of carboxylic acid due to the exposure. Thus, the percarboxylic acid 69 (FIG. 9B) is not generated by the reaction between the carboxylic acid and the etchant 89 (FIG. 5) (see FIG. 10B). Thus, the Ti film 41 is prevented from being corroded at the interface between the resist layer 60 and the Ti film 41, at the end of the resist layer 60 formed of the positive photoresist. Therefore, the precision in patterning by the wet etching can be enhanced.

Preferably, the process substrate 100W is stored in the dark box 70 (FIG. 4) after the resist layer 60 is developed and before the wet etching is performed. Thus, the Ti film 41 is further prevented from being corroded at the interface between the resist layer 60 and the Ti film 41, at the end of the resist layer 60 formed of the positive photoresist. Therefore, the precision in patterning by the wet etching can be further enhanced.

In the case where the aqueous solution containing hydrogen peroxide is used as the etchant 89, the Ti film 41 is likely to be corroded in particular due to the hydrogen peroxide, at the interface between the resist layer 60 and the Ti film 41, at the end of the resist layer 60 formed of the positive photoresist. However, according to this embodiment, this corrosion can be prevented.

In the case where the Ti film 41 is used as the metal film to be etched away, the metal film is especially likely to be corroded at the interface between the resist layer 60 and the metal film, at the end of the resist layer 60 formed of the positive photoresist because Ti is easily oxidized. However, according to this embodiment, this corrosion can be prevented.

In the case where the silicon carbide substrate 10 is used as the semiconductor substrate, the semiconductor substrate and the Ti film 41 form the schottky junction, so that the SiC/Ti schottky junction, which is highly useful for a power device, can be provided in the power device 100. According to this embodiment, in this device, the Ti film 41 serving as the schottky electrode can be patterned with high precision.

In the case where the resist layer 60 is formed of the positive photoresist containing the novolac-type material, the Ti film 41 is especially likely to be corroded due to the generation of carboxylic acid from the novolac-type material, at the interface between the resist layer 60 and the Ti film 41, at the end of the resist layer 60. Especially, in the case where the wet etching is performed with an aqueous solution containing hydrogen peroxide, percarboxylic acid is likely to be generated due to the reaction between the carboxylic acid from the novolac-type material and the hydrogen peroxide. However, according to this embodiment, this corrosion can be prevented.

The embodiment of present invention can be appropriately modified or omitted within the scope of the present invention. For example, the metal film is not limited to the film formed only of the Ti film, and it may include another layer in addition to the Ti film, or may be a metal layer other than the Ti film. The semiconductor device is not limited to the schottky barrier diode, and it may be another diode such as a PiN diode, or may be a transistor such as a MISFET (Metal Insulator Semiconductor Field Effect Transistor) or an IGBT (Insulated Gate Bipolar Transistor). The semiconductor substrate is not limited to the one made from silicon carbide, and it may be made from a wide bandgap semiconductor other than silicon carbide, or may be made from silicon. The etching apparatus is not limited to the one in which the semiconductor substrate is soaked in the etchant stored in the bath, and it may be any etching apparatus as long as the etchant is supplied onto the semiconductor substrate. The positive photoresist is not limited to the one having photosensitivity to the g-line wavelength, and as long as it has photosensitivity to at least one wavelength, it may have photosensitivity to an h-line or i-line wavelength. Depending on which wavelength is selected, the lighting apparatus is not limited to the one that emits the light perceived as yellow, and it may emit light perceived as almost white when the wavelength to be cut off is substantially in an ultraviolet light region. The interlayer insulating film is not limited to the TEOS film, and it may be a silicon dioxide film made from a material other than TEOS, or it may be an insulating film made from a material other than silicon dioxide. The transportation of the semiconductor substrate to the etching apparatus or from the etching apparatus is not limited to the one performed by the operator, but it may be performed by a machine such as a robot. The first and second conductivity types may be switched with each other.

The present invention has been described in detail, but the above description has been provided just for illustrative purposes in all aspects, so that the present invention is not limited thereto. It is to be understood that a number of variations which have not been illustrated can be envisioned without departing from the scope of the present invention.

REFERENCE SIGNS LIST

10: silicon carbide substrate (semiconductor substrate), 11: single-crystal substrate, 20: epitaxial layer, 30: interlayer insulating film, 40: anode electrode, 41: Ti film, 42: pad electrode, 51: cathode electrode, 52: protective film, 60: resist layer, 70: dark box (container), 80: etching apparatus, 81: case, 82: bath, 89: etchant, 90: yellow lamp (lighting apparatus), 100: power device (semiconductor device)

The invention claimed is:

1. A semiconductor device manufacturing method comprising the steps of:
applying a resist layer to a metal film disposed on a semiconductor substrate, using a positive photoresist having photosensitivity to at least one wavelength;
exposing said resist layer to light including a region of said one wavelength;
developing said exposed resist layer; and
subjecting said metal film to wet etching with said resist layer used as a mask, in an etching apparatus after the step of developing said resist layer, wherein said etching apparatus is placed in an environment irradiated with a lighting apparatus that emits light with a wavelength equal to or shorter than said one wavelength cut off, in the step of subjecting said metal film to said wet etching, an aqueous solution containing hydrogen peroxide is used as an etchant, said metal film includes a Ti film, and said positive photoresist contains a novolac material.

2. The semiconductor device manufacturing method according to claim 1, further comprising a step of storing said semiconductor substrate in a container having a light shielding property, after the step of developing said resist layer and before the step of subjecting said metal film to said wet etching.

3. The semiconductor device manufacturing method according to claim 1, wherein said semiconductor substrate is a silicon carbide substrate, and said silicon carbide substrate and said Ti film form a schottky junction.

4. The semiconductor device manufacturing method according to claim 1, wherein said positive photoresist has photosensitivity to light having a wavelength of 436 nm.

* * * * *